(12) United States Patent  
Launay

(10) Patent No.: US 7,399,710 B2  
(45) Date of Patent: Jul. 15, 2008

(54) METHOD OF CONTROLLING THE PRESSURE IN A PROCESS CHAMBER

(75) Inventor: Nicolas Launay, Annecy (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 11/451,443

(22) Filed: Jun. 13, 2006

(65) Prior Publication Data

US 2006/0281324 A1 Dec. 14, 2006

(30) Foreign Application Priority Data

Jun. 14, 2005 (FR) .................................. 05 51589

(51) Int. Cl.
*H01L 21/302* (2006.01)
*H01L 21/461* (2006.01)

(52) U.S. Cl. .................... 438/710; 438/714; 438/719

(58) Field of Classification Search .................... None  
See application file for complete search history.

(56) References Cited

U.S. PATENT DOCUMENTS

| 6,051,503 | A  | * | 4/2000  | Bhardwaj et al. | ............ 438/705 |
| 6,261,962 | B1 | * | 7/2001  | Bhardwaj et al. | ............ 438/702 |
| 7,041,224 | B2 | * | 5/2006  | Patel et al.    | ............... 216/2 |
| 7,074,723 | B2 | * | 7/2006  | Chinn et al.    | ............ 438/714 |
| 2004/0235307 | A1 | | 11/2004 | Johnson et al. | |

FOREIGN PATENT DOCUMENTS

EP 0 822 584 2/1998  
EP 1 079 425 2/2001

* cited by examiner

*Primary Examiner*—Duy-Vu N Deo  
(74) *Attorney, Agent, or Firm*—Sughrue Mion, PLLC

(57) ABSTRACT

The present invention consists in a method of plasma treatment of a semiconductor substrate in a process chamber connected to a vacuum line via a valve, said treatment including a plurality of cycles comprising at least one etching step during which an etching gas is introduced alternating with at least one passivation step during which a passivation gas is introduction into said chamber, which method includes the following operations:

(a) a reference pressure $P_{ref}$ is defined at which it is wished to effect the treatment,
(b) the position of the valve is fixed during the first etching step,
(c) the pressure in the process chamber is allowed to stabilize during n cycles,
(d) the pressure in the process chamber is measured during the etching step during m cycles, with m at least equal to 2, and an average pressure value $P_c$ is calculated from the measurements effected,
(e) after n+m cycles, the position of the valve is corrected with a view to obtaining a pressure in the process chamber that approximates the reference pressure value $P_{ref}$,
(f) the steps (c) to (e) are repeated until the calculated average pressure $P_c$ is substantially equal to the reference pressure value $P_{ref}$ so that it is no longer necessary to correct the position of the valve.

7 Claims, 4 Drawing Sheets

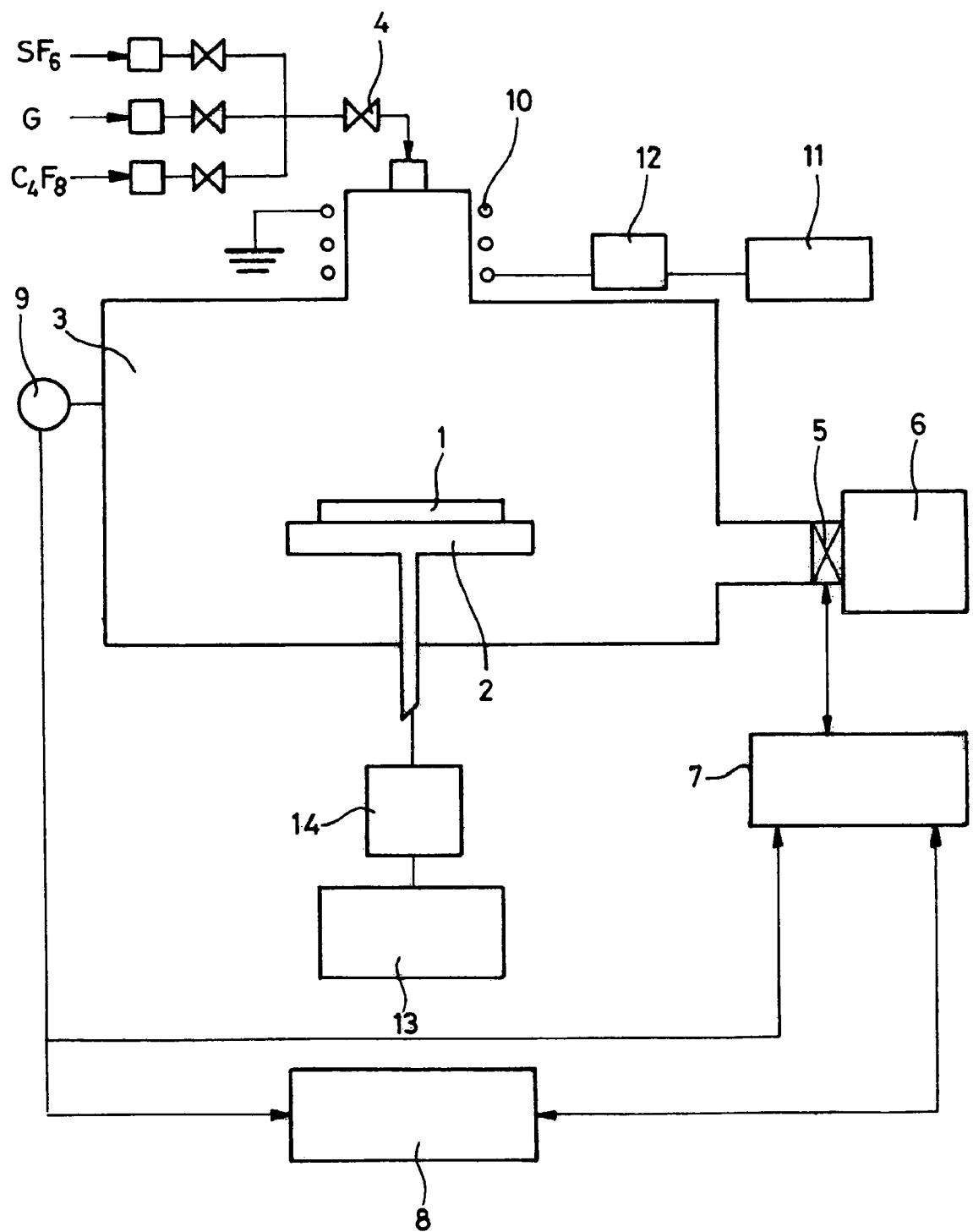
FIG_1

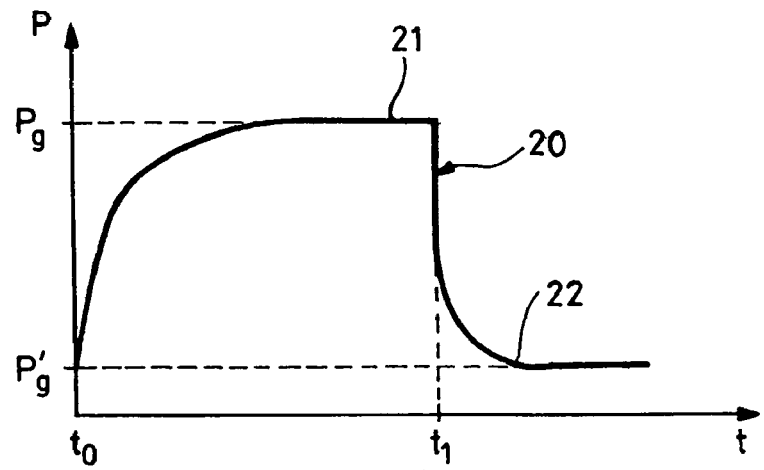
FIG_2A
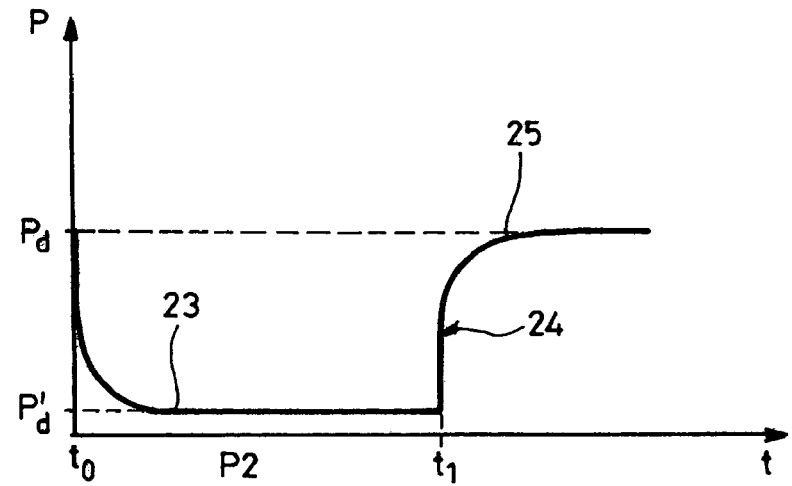
FIG_2B
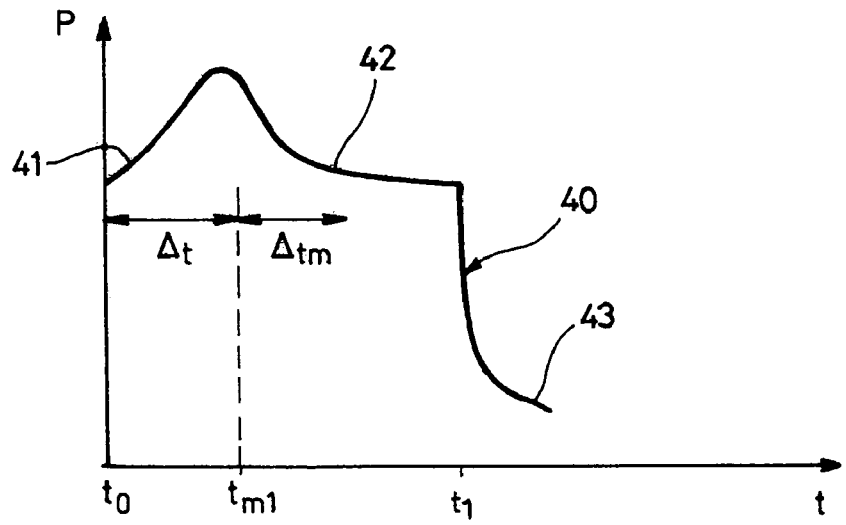
FIG_4

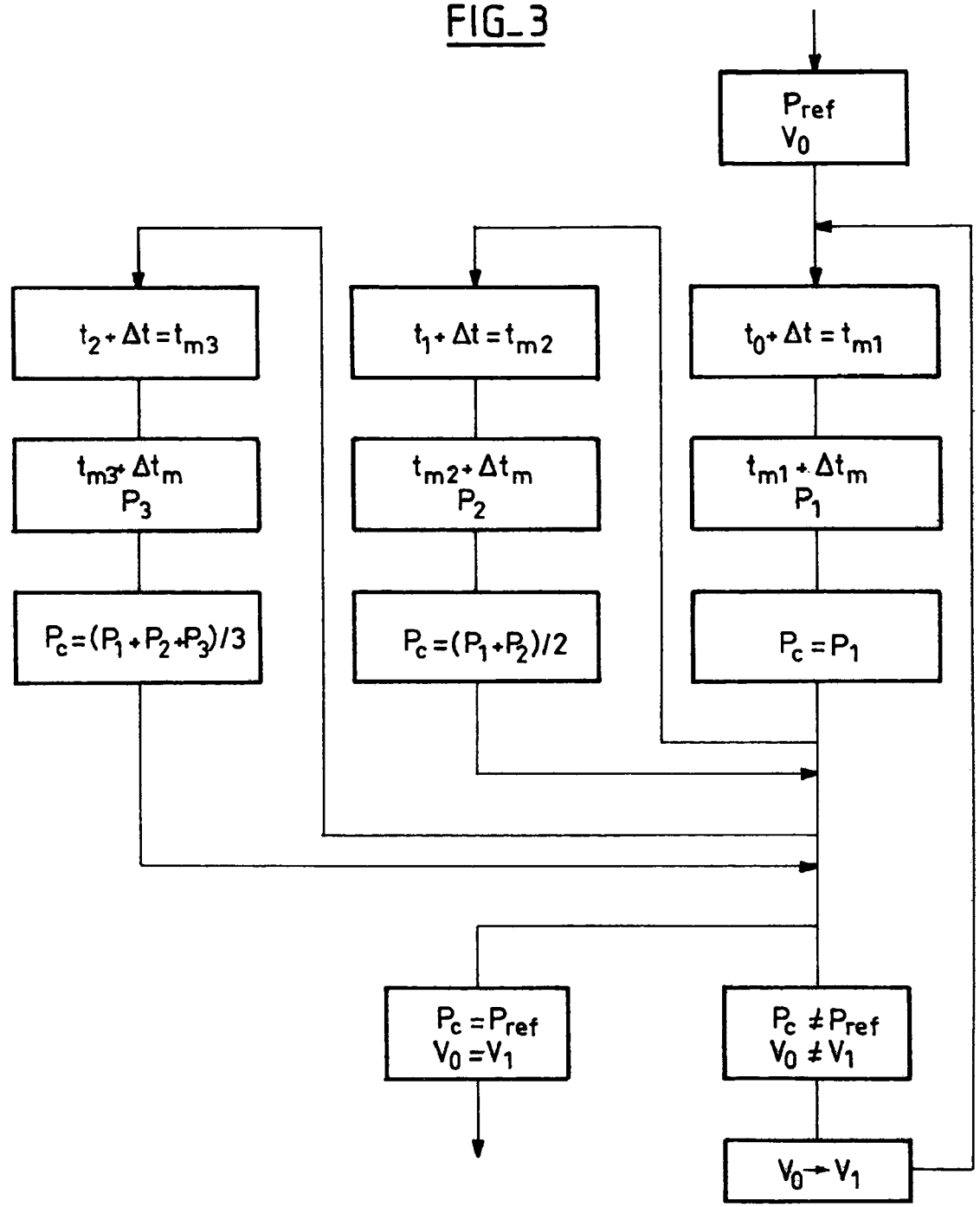
FIG_3

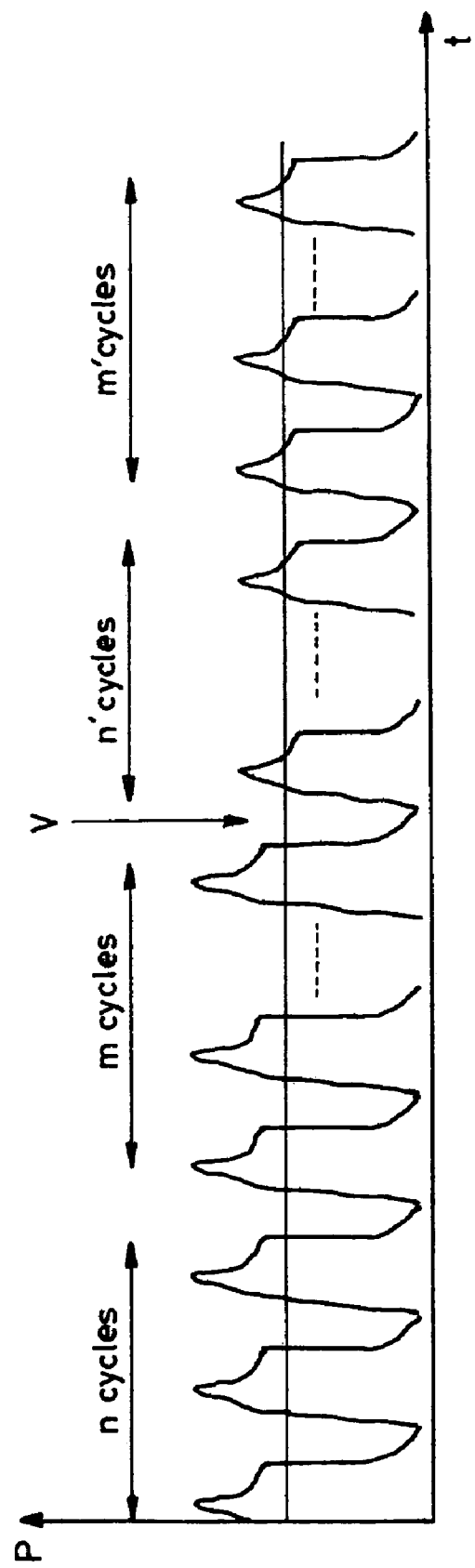
FIG_5

METHOD OF CONTROLLING THE PRESSURE IN A PROCESS CHAMBER

CROSS-REFERENCE TO RELATED APPLICATIONS

This application is based on French Patent Application No. 0551589 filed Jun. 16, 2005, the disclosure of which is hereby incorporated by reference thereto in its entirety, and the priority of which is hereby claimed under 35 U.S.C. §119.

BACKGROUND OF THE INVENTION

1. Field of the Invention

The present invention concerns the field of micromachining semiconductor substrates for the production of micro-electro-mechanical systems (MEMS) or micro-opto-electro-mechanical systems (MOEMS). It relates more particularly to the control and to the regulation of the gas pressure in the process chamber during the different steps of the fabrication of semiconductor components by the alternating plasma etching technique, in particular to the process utilized.

2. Description of the Prior Art

In industrial processes for fabricating or processing products in enclosures supplied with processing gas at very low pressures, it is necessary to regulate the pressure in the enclosure. This is the case, for example, in methods of fabricating or processing semiconductors and micro-electro-mechanical systems (MEMS).

The substrate is placed in a vacuum enclosure containing active gases that are ionized by plasma generation means. The processing generally comprises successive steps that take place in a process chamber in a low-pressure atmosphere enabling a plasma to be established and maintained.

For certain applications, processes employing alternating flows of different gases are used. For example in the case of etching silicon, it is common practice to use a succession of cycles each comprising two steps: an etching step comprising the introduction of a gas or a gas mixture containing fluorine, such as $SF_6$, and a step of deposition of a passivation film onto the surfaces comprising the introduction of a gas CxFy, such as $C_4F_8$ for example. One or several supplementary steps comprising the introduction of a neutral or cleaning gas may be added. Each step includes the simultaneous injection of gas into the process chamber and for each step there is defined a constant gas flow rate. However, the nature and the flow rate of the gas vary from one step to another, which causes a variation of the pressure in the process chamber in each step. That pressure is an important parameter for the control and reproducibility of the performance of the process step. Thus each step is characterized by a gas pressure in the process chamber that it is necessary to control and to regulate optimally.

The appropriate vacuum necessary for the different process steps is generated and maintained by a vacuum line comprising vacuum pumps connected to the process chamber. It is possible to adjust the pressure in the process chamber using a throttle valve disposed at the inlet of the pumping line. However, the duration of each step being variable and relatively short (a few milliseconds to a few seconds), the response time of the valve prevents accurate control of the pressure. The choice is therefore usually made to impose on the valve a position that is constant throughout the treatment and that makes it possible to control the pressure approximately.

A variation of pressure in time is also observed for the same process. It is known that, for the same position of the valve, the pressure in the process chamber can vary according to the state of the reactor, all other things being equal. The pressure drift observed may be due to a modification of the state of cleanliness of the reactor, for example because of the deposition of products of degradation generated during the treatment. This variation depends also on the type of throttle valve. Consequently, it is necessary to define for each installation, and as a function of the evolution of the condition of the reactor, a different position of the valve for each of the steps of the treatment effected.

The document WO-2004/093165 proposes a method of controlling the pressure during the alternation of etching and passivation steps. The method consists in, at the beginning of the treatment, fixing the position of the valve connecting the process chamber to the turbo pump independently for each step. The starting position of the valve is determined as a function of data acquired during one or more earlier steps of the same type (this is called "position" mode control). After at least a portion of the step in that position, the pressure is then regulated by varying the position of the valve by means of a control algorithm (this is called "pressure" mode control).

As the pressure in the process chamber is an important parameter for the control and the reproducibility of the performance of the plasma etching treatment, it is necessary to regulate that parameter precisely. An object of the present invention is to minimize the pressure drift during the treatment by proposing a method of controlling and regulating the pressure in a process chamber.

SUMMARY OF THE INVENTION

The subject matter of the present invention is a method of plasma treatment of a semiconductor substrate in a process chamber connected to a vacuum line via a valve, said treatment including a plurality of cycles comprising at least one etching step during which an etching gas is introduced alternating with at least one passivation step during which a passivation gas is introduction into said chamber, which method includes the following operations:

(a) a reference pressure $P_{ref}$ is defined at which it is wished to effect the treatment, (b) the position of the valve is fixed during the first etching step, (c) the pressure in the process chamber is allowed to stabilize during n cycles, (d) the pressure in the process chamber is measured during the etching step during m cycles, with m at least equal to 2, and an average pressure value $P_c$ is calculated from the measurements effected, (e) after n+m cycles, the position of the valve is corrected with a view to obtaining a pressure in the process chamber that approximates the reference pressure value $P_{ref}$, (f) the steps (c) to (e) are repeated until the calculated average pressure $P_c$ is substantially equal to the reference pressure value $P_{ref}$ so that it is no longer necessary to correct the position of the valve.

The expression "substantially equal" means that the mean pressure calculated from the measured pressures is in a region of tolerance around the pressure value defined as a reference value from ±1% to ±5%.

The measurement of pressure is advantageously effected after a time Δt of the order of one third of the total time of the etching step in order to obtain a stable pressure.

The measurement of pressure is even more advantageously effected during a time $\Delta t_m$ of the order of one third of the total time of the etching step to obtain a value representative of the average pressure in the process chamber during the etching step.

The initial position of the valve is determined on the basis of a calibration carried out beforehand or of experience acquired with the treatment. In practical terms, the position of the valve is corrected stepwise. For example, each step may represent 1% of the total opening of the valve. This means that in this case the position of the valve can be corrected by 10 steps at most in either direction. Of course, any other step value may equally well be chosen.

The measurements are preferably effected over a number m of cycles at least equal to 3.

During the step of deposition of a passivation film, the position of the valve is the same as that in the immediately preceding etching step. The position of the valve does not vary during the deposition step.

Other features and advantages of the present invention will become apparent on reading the following description of one embodiment, given of course by way of illustrative and non-limiting example, and in the appended drawing.

BRIEF DESCRIPTION OF THE DRAWING

FIG. 1 represents diagrammatically an installation for fabricating semiconductor components.

FIG. 2 is a diagram of the theoretical variation of partial pressure P as a function of time t during a treatment cycle including two steps, respectively, on the one hand, the etching gas or gas mixture partial pressure (FIG. 2A) and, on the other hand, the passivation gas or gas mixture partial pressure (FIG. 2B).

FIG. 3 shows diagrammatically the pressure control and regulation method of the invention.

FIG. 4 shows the evolution of the total pressure P in the process chamber as a function of the time t during a treatment cycle including two steps when the method of the invention is applied.

FIG. 5 shows the evolution of the total pressure P in the process chamber as a function of the processing time when the method of the invention is used.

DETAILED DESCRIPTION OF THE PREFERRED EMBODIMENTS

The installation represented in FIG. 1 is an installation conventionally used for micromachining silicon substrates by plasma etching. The substrate 1 is placed on a support 2 that may be mobile and is disposed in a process chamber 3.

During the treatment, steps of etching the substrate 1 with a plasma of a fluorinated gas, such as $SF_6$, alternate with surface passivation steps using a plasma of a gas $C_xF_y$, such as $C_4F_8$, for example. There may also be provision for the introduction of a neutral or cleaning gas G. The treatment gases are introduced into the process chamber 3 by an admission device including a valve 4. The pressure in the process chamber 3 is controlled by means of a throttle valve 5 disposed at the inlet of the vacuum line 6 comprising pumps and associated with a controller 7 controlled by a computer 8. The pressure in the process chamber 3 is measured by apparatus 9 such as a manometer.

During the etching step, the active gas is excited to form a plasma by means of a winding 10 supplied with power by a radio-frequency generator 11 via an adapter network 12. The ions produces are accelerated toward the substrate 1 by the effect of polarization of the substrate by a radio-frequency or low-frequency generator 13 associated with an adapter network 14 and bombarding the surfaces of the substrate 1 that are normal to the direction of bombardment. The substrate 1 is attacked isotropically by the fluorine atoms and by the neutral species also resulting from the excitation of the etching gas reacting chemically with the surface of the substrate 1.

During the passivation step, the gas or gas mixture is excited in the same way by the radio-frequency generator system 10, 11, 12 and produces polymerizable species that are deposited in the form of a polymer film over all the surfaces of the substrate 1 exposed to the plasma. The vertical surfaces and the horizontal surfaces are covered in this way.

During the subsequent etching step, and by the combined action of the vertical ionic bombardment obtained for the negative polarization of the substrate, the polymer film is sprayed and removed on the horizontal surfaces, and vertical etching of the substrate may continue, although the polymer remaining on the vertical surfaces temporarily opposes the action of the plasma on those vertical surfaces. By repeating in this way the steps of etching with a fluorinated gas plasma and the steps of passivation using a plasma of the gas $C_xF_y$, isotropic etching of the substrate is obtained.

A cycle may also include supplementary steps, that are neither passivation nor etching steps, using neutral or cleaning gases.

During a treatment cycle including two steps, the pressures evolve broadly speaking as represented in FIG. 2.

At the beginning $t_0$ of the etching step, a fluorinated gas is introduced into the process chamber at a partial pressure represented by the curve 20. The portion 21 of the curve 20 rises to a pressure value $P_g$. The passivation gas has a partial pressure $P'_d$ that is represented by the portion 23 of the curve 24 (FIG. 2B).

At the end $t_f$ of the etching step, the introduction of the etching gas is stopped, and the portion 22 of its pressure curve 20 shows that the partial pressure of the etching gas falls to a value $P'_g$ (FIG. 2A). Simultaneously, the passivation gas is introduced at a partial pressure represented by the curve 24. The portion 25 of the curve 24 shows that the partial pressure of the passivation gas rises to a pressure value $P_d$(FIG. 2B).

FIG. 3 represents diagrammatically the method of the invention. At the beginning $t_0$ of the etching step, the etching gas is introduced into the process chamber 3 via the valve 4. The throttle valve 5 is then placed in an arbitrary position $V_0$ in order to adjust the pumping speed. The position $V_0$ of the valve is maintained constant during a few cycles in order to allow the pressure to stabilize. What is more, a reference pressure $P_{ref}$ is defined at which it is wished to work.

After the beginning to of an etching step, the position $V_0$ of the valve is maintained for a time interval $\Delta t$ preferably corresponding to about one third of the total duration of the etching step. After a time $t_{m1}=t_0+\Delta t$, the average pressure in the process chamber is measured during a time $\Delta t_m$ and has a value $P_1$. The value $P_c$ of the average pressure is therefore here equal to the value P1 of the average pressure measured in the time interval considered.

The pressure in the process chamber varies as represented by the curve 40 in FIG. 4. During the introduction of the etching gas, the throttle valve 5 being maintained in a fixed position, the pressure rises as shown by the portion 41 of the curve 40 corresponding to the time interval $\Delta t$. The consumption of gas by the etching of the substrate then decreases and the pressure is thereafter stabilized (portion 42 of the curve 40). It is during this period $\Delta t_m$ that the average pressure is measured. The measurement time $\Delta t_m$ can reach one third of the total duration of the step. At the end of the etching step, the admission of etching gas is stopped and the pressure falls during a short time (portion 43 of the curve 40) before the admission of the passivation gas causes it to rise again.

During the etching step of the next cycle, the pressure measurement is repeated after the same time interval $\Delta t$ from the beginning $t_1$ of the etching step of the next cycle. After a time $t_{m2}=t_1+\Delta t$, the average pressure in the process chamber is measured during a time $\Delta t_m$ and has a value $P_2$. The calculated value $P_c$ of the average pressure is then redefined so as to be equal to the average value $(P_1+P_2)/2$ of the two measurements.

After a time $t_{m3}=t_2+\Delta t$ from the beginning $t_2$ of the etching step of the next cycle, the measurement of the average pressure in the process chamber may be repeated, as shown in FIG. 3. The value of the calculated average pressure $P_c$ is redefined again so that it is equal to the average value $(P_1+P_2+P_3)/2$ of the three measurements.

The values of $P_1$, $P_2$ and $P_3$ are usually from 0.5 Pa to 30 Pa. This measurement may be effected over as many cycles as necessary.

If the calculated average pressure $P_c$ is different from the value of the reference pressure $P_{ref}$, the throttle valve 5 is moved from the position $V_0$ to the position $V_1$ in order to reduce the observed difference $P_c-P_{ref}$ between the calculated average pressure $P_c$ in the process chamber and the value of the reference pressure $P_{ref}$.

When the position of the valve has been corrected, there is a wait of a few cycles to allow the pressure to stabilize before repeating a series of measurements analogous to what has just been described. The value of the reference pressure $P_{ref}$ is redefined if necessary and the position of the valve 5 modified accordingly. A difference from 1% to 5% between the reference value $P_{ref}$ and the average pressure value $P_c$ calculated from the measurements is tolerated.

At the end of a certain number of cycles, the pressure has stabilized. It is no longer necessary to modify the position of the throttle valve. If the value of the calculated average pressure $P_c$ is constant and substantially equal to the value of the reference pressure $P_{ref}$, the position of the valve is not modified after the measurements. Pressure checks can then be effected less frequently if required.

If there is observed over time a drift in the calculated average pressure $P_c$ in the process chamber during the etching step compared to the value of the reference pressure $P_{ref}$, the measurements may be done again and the position of the throttle valve 5 readjusted.

FIG. 5 shows the effect of the method of the invention on the evolution of the pressure P in the process chamber during the processing time t. During n cycles (three cycles are represented here), the pressure is maintained by the initial position of the valve. During the next m cycles, pressure measurements are effected and an average pressure is recalculated after each cycle. After (n+m) cycles, the position of the valve is modified (indicated by V in the diagram). In the example given, the measured pressure was too high and the position of the valve has been modified to lower the pressure slightly.

The pressure is then allowed to stabilize for n' cycles, after which measurements are effected again over m' cycles. If necessary, the position of the valve can be modified again.

The present invention is not limited to the embodiments that have been described explicitly, but includes the diverse variants and generalizations that will be obvious to the person skilled in the art.

There is claimed:

1. A method of plasma treatment of a semiconductor substrate in a process chamber connected to a vacuum line via a valve, said treatment including a plurality of cycles comprising at least one etching step during which an etching gas is introduced alternating with at least one passivation step during which a passivation gas is introduction into said chamber, the method comprising:
    (a) defining a reference pressure $P_{ref}$ at which the treatment is to be performed,
    (b) fixing a position of the valve during the first etching step,
    (c) allowing a pressure in the process chamber to stabilize during n cycles,
    (d) measuring the pressure in the process chamber during the etching step during m cycles, with m at least equal to 2, and calculating an average pressure value $P_c$ from the measured pressure,
    (e) after n+m cycles, correcting the position of the valve to obtain a pressure in the process chamber that approximates the reference pressure value $P_{ref}$,
    (f) repeating the steps (c) to (e) until the calculated average pressure $P_c$ is substantially equal to the reference pressure value $P_{ref}$ so that it is no longer necessary to correct the position of the valve.

2. The method according to claim 1, wherein the measuring of the pressure is performed after a time $\Delta t$ of the order of one third of a total time of the etching step.

3. The method according to claim 1, wherein the measuring of the pressure is performed during a time $\Delta t_m$ of the order of one third of a total time of the etching step.

4. The method according to claim 1, wherein m is at least equal to 3.

5. The method according to claim 1, wherein n is at least equal to 2.

6. The method according to claim 1, wherein the position of the valve is corrected by one step after each series of measurements, each step representing 1% of the total opening of the valve.

7. The method according to claim 6, wherein the position of the valve is corrected by a maximum of ten steps in both directions during the treatment.

* * * * *